US009147661B1

(12) United States Patent
Kwon et al.

(10) Patent No.: US 9,147,661 B1
(45) Date of Patent: Sep. 29, 2015

(54) SOLDER BUMP STRUCTURE WITH ENHANCED HIGH TEMPERATURE AGING RELIABILITY AND METHOD FOR MANUFACTURING SAME

(71) Applicant: Xilinx, Inc., San Jose, CA (US)

(72) Inventors: Woon-Seong Kwon, Cupertino, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/171,517

(22) Filed: Feb. 3, 2014

(51) Int. Cl.
*H01L 23/00* (2006.01)

(52) U.S. Cl.
CPC ............... *H01L 24/13* (2013.01); *H01L 24/11* (2013.01); *H01L 24/14* (2013.01)

(58) Field of Classification Search
CPC .......... H01L 24/13; H01L 24/11; H01L 24/14
See application file for complete search history.

(56) References Cited

U.S. PATENT DOCUMENTS

| | | | |
|---|---|---|---|
| 5,440,239 A | 8/1995 | Zappella et al. | |
| 6,268,739 B1 | 7/2001 | Bernier et al. | |
| 8,779,588 B2 * | 7/2014 | Yu et al. | 257/737 |
| 2002/0093096 A1 | 7/2002 | Tago et al. | |
| 2004/0266066 A1 | 12/2004 | Wang | |

OTHER PUBLICATIONS

Chen, Y.Y et al., "Single-joint shear strength of micro Cu pillar solder bumps with different amounts of intermetallics," *Microelectronics Reliability*, Jan. 2013, vol. 53, Issue 1, pp. 47-52, Elsevier, New York, New York, USA, www.sciencedirect.com.

I-Micronews, "Fine pitch microjoints: a closer look," *I-Micronews*, Advanced Packaging, Jun. 24, 2011, pp. 1-3, I-Micronews, www.i-micronews.com.

Kwon, Woon-Seong, "Enabling a Manufacturable 3D Technologies and Ecosystem using 28nm FPGA with Stack Silicon Interconnect Technology," *Proc. of the 48th International Symposium on Microelectronics (IMAPS 2013)* Sep. 30, 2013, pp. 1-6, International Microelectronics Assembly and Packaging Society (IMPAS), www.imaps.org.

Mu, Dekui et al., "Creep and Mechanical Properties of $Cu_6Sn_5$ and $(Cu,Ni)_6SN_5$ at Elevated Temperatures," *Journal of Electronic Materials*, Feb. 2013, vol. 42, Issue 2, pp. 304-311, Springer, www.springer.com.

* cited by examiner

*Primary Examiner* — William Coleman
(74) *Attorney, Agent, or Firm* — Keith Taboada; Neil Morrissette (57) ABSTRACT

Implementations described herein generally relate to chip packaging, and in particular, to solder bump structures for a semiconductor device and methods of fabricating the same. In one implementation, a solder bump assembly is provided. The solder bump assembly comprises a conductive bond pad formed on a substrate. A conductive pillar is formed on the conductive bond pad. A plating layer is formed on the conductive pillar, wherein the plating layer comprises copper and nickel. A solder bump is formed on the plating layer in electrical communication with the plating layer. The plating layer may be a bi-layer structure comprising a nickel layer formed on the conductive pillar and a copper layer formed on the nickel layer in electrical communication with the solder bump. The plating layer may be a copper-nickel alloy.

20 Claims, 8 Drawing Sheets

SOLDER BUMP STRUCTURE WITH ENHANCED HIGH TEMPERATURE AGING RELIABILITY AND METHOD FOR MANUFACTURING SAME

TECHNICAL FIELD

Implementations described herein generally relate to chip packaging, and in particular, to solder bump structures for a semiconductor device and methods of fabricating the same.

BACKGROUND ART

An increasing demand for electronic equipment that is smaller, lighter, and more compact has resulted in a concomitant demand for semiconductor packages that have smaller outlines and mounting areas or "footprints." One response to this demand has been the development of the "flip-chip" method of attachment and connection of semiconductor chips or "dice" to substrates (e.g., PCBs or lead-frames). Flip-chip mounting involves the formation of bumped contacts (e.g., solder balls) on the active surface of the die, then inverting or "flipping" the die upside down and reflowing the bumped contacts (i.e., heating the bumped contacts to the melting point) to form solder joints fusing the bumped contacts to the corresponding pads on the substrate.

In flip-chip mounting and connection methods, thermomechanical reliability is becoming an increasing concern of the electronics industry. Notably, the reliability of the solder joints is one of the most critical issues for successful application of such mounting and connection methods. However, solder joints formed using known methods may be prone to cracks at high-stress points due to thermal stress cycling.

Therefore, there is a need for improved solder joints and methods of forming improved solder joints for an integrated circuit.

SUMMARY

Implementations described herein generally relate to chip packaging, and in particular, to solder joints for a semiconductor device and methods of fabricating the same. In one implementation, a solder bump assembly is provided. The solder bump assembly comprises a conductive bond pad formed on a substrate, a conductive pillar formed on the conductive pad, and a plating layer formed on the conductive pillar. The plating layer comprises copper and nickel. A solder bump is formed on the plating layer and is in electrical communication with the plating layer.

In another implementation, an integrated circuit device is provided. The integrated circuit device comprises a substrate, an integrated circuit formed on the substrate, a plurality of conductive bond pads formed in the integrated circuit, and a plurality of solder bump assemblies. Each conductive bond pad of the conductive bond pads is enabled to form an electrical coupling with a portion of the integrated circuit. Each solder bump assembly of the plurality of solder bump assemblies is enabled to form an electrical coupling between a conductive bond pad and circuitry outside the integrated circuit device. Each solder bump assembly comprises a conductive pillar formed on the conductive bond pad, a plating layer formed on the conductive pillar, wherein the plating layer comprises copper and nickel, and a solder bump formed on the plating layer and in electrical communication with the plating layer.

In yet another implementation, a method for fabricating a solder bump assembly is provided. The method comprises forming a first conductive pillar on a first conductive bond pad deposited on a substrate, forming a first plating layer comprising copper and nickel on the first conductive pillar, and forming a first lead-free solder bump on the first plating layer, wherein the first lead-free solder bump includes tin and silver.

BRIEF DESCRIPTION OF THE DRAWINGS

So that the above recited features can be understood in detail, a more particular description may be had by reference to various exemplary embodiments, some of which are illustrated in the appended drawings. It is to be noted, however, that the appended drawings illustrate only exemplary implementations, and are therefore not to be considered limiting.

To facilitate understanding, identical reference numerals have been used, where possible, to designate identical elements that are common to the figures. It is contemplated that elements of one embodiment may be beneficially incorporated in other embodiments. However, in some embodiments non-identical elements having the same functions can be substituted.

DETAILED DESCRIPTION

Implementations described herein generally relate to chip packaging, and in particular, to solder bump structures for a semiconductor device and methods of fabricating the same. High Temperature Storage (HTS) tests are typically performed to determine the effect on devices of long-term storage at elevated temperatures without any electrical stresses applied. For stacked silicon interconnect (SSIT) production, solder micro-bump joints often suffer from HTS aging reliability issues. Both the limited tin volume in the solder micro-bump joint and volume shrinkage due to the fast formation of tin intermetallic compounds (IMC) (e.g., nickel-tin and copper-tin) during HTS testing lead to volumetric voiding and/or cracking defects within the solder micro-bump joints. In some implementations described herein, a nickel barrier layer for suppression of the IMC reaction and a surface copper layer are provided to minimize the undesirable void formation that leads to voiding or cracking defects within the solder micro-bump joint. This reduction in voiding or cracking defects increases the durability and reliability of the package. Although the implementations described herein are discussed in terms of solder micro-bump structures, it should be understood that the implementations described herein are also applicable to solder bump structures of other sizes, for example, C4 solder bump structures.

Figure 1:
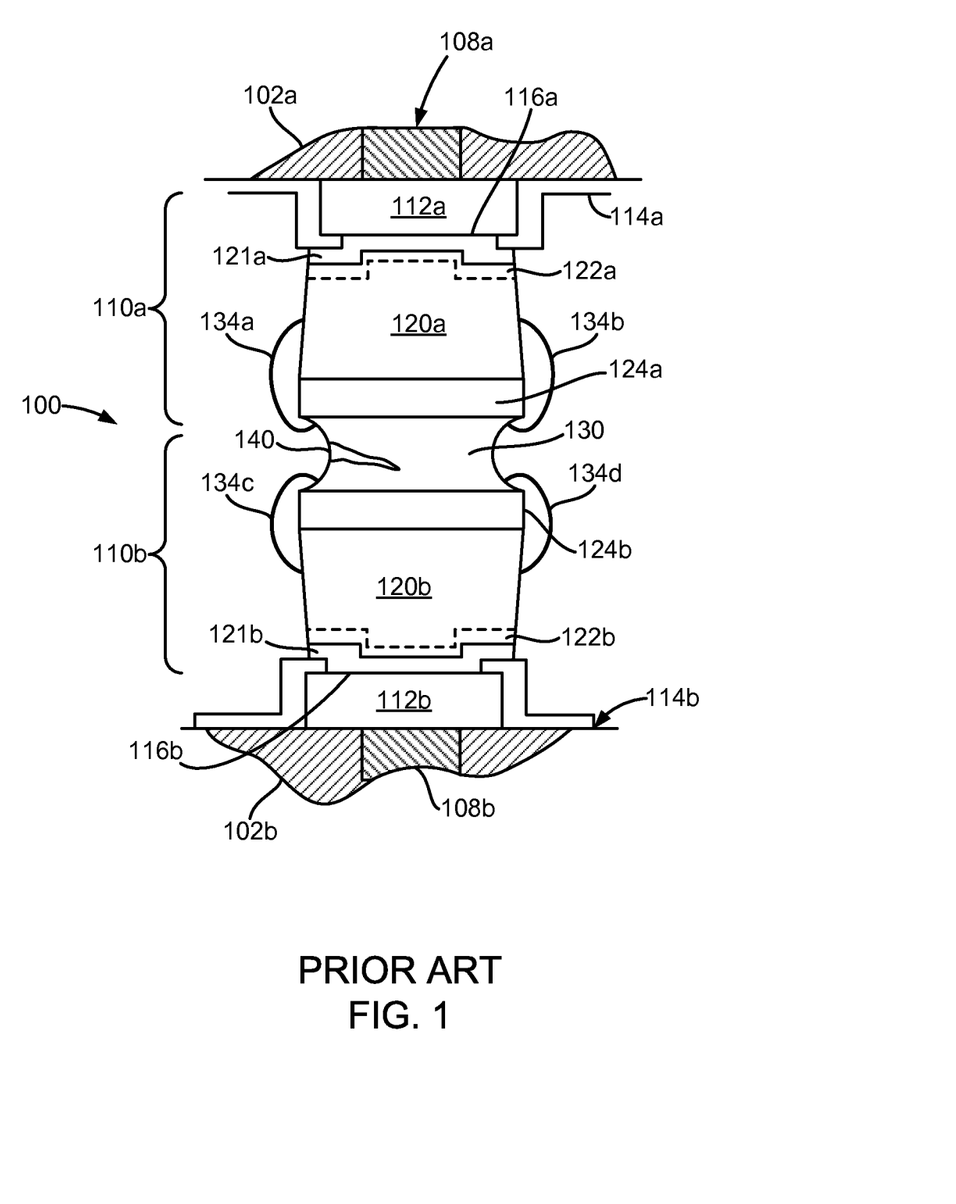
FIG. 1 is a partial schematic side view of a conventional solder micro-bump connection.

FIG. 1 is a partial schematic side view of a conventional solder micro-bump connection 100 formed using implementations known in the art. The solder micro-bump connection 100 electrically couples a first substrate assembly 102a with a second substrate assembly 102b. The solder micro-bump connection 100 comprises a first solder micro-bump assembly 110a coupled with a second solder micro-bump assembly 110b. It should be noted that FIG. 1 shows the first solder micro-bump assembly 110a coupled with a second solder micro-bump assembly 110b after exposure to a solder reflow process to couple the micro-bump assemblies 110a, 110b together, thus forming the solder micro-bump connection 100.

Each substrate assembly 102a, 102b may independently comprise a semiconductor chip or die (e.g., a die configured for flip-chip bonding). Each substrate assembly 102a, 102b comprises a layer of metal that is deposited using known techniques to define a conductive bond pad 112a, 112b. Each conductive bond pad 112a, 112b may be in electrical communication with one or more circuit traces (108a, 108b) or a plated through-hole, called a "via" (not shown), as is well known in the art.

A passivation layer 114a, 114b is formed over each substrate 102a, 102b and a portion of each conductive bond pad 112a, 112b. Each passivation layer 114a, 114b may be a silicon nitride layer. The silicon nitride layer may be deposited on the substrate 102a, 102b using a chemical vapor deposition (CVD) process. An aperture 116a, 116b is formed in each passivation layer 114a, 114b to expose at least a portion of each conductive bond pad 112a, 112b.

A copper pillar 120a, 120b is formed within each aperture 116a, 116b. Each copper pillar 120a, 120b is electrically and mechanically connected to the exposed portion of each conductive bond pad 112a, 112b. As depicted in FIG. 1, each copper pillar 120a, 120b extends above a top surface of each passivation layer 114a, 114b. In some implementations, an adhesion/barrier layer 121a, 121b is formed over each passivation layer 114a, 114b and within each aperture 116a, 116b prior to deposition of the conductive pillar 120a, 120b. In some implementations, a conductive seed layer 122a, 122b is formed over the adhesion/barrier layer 121a, 121b prior to deposition of the copper pillar 120a, 120b and the copper pillar 120a, 120b is formed on the conductive seed layer 122a, 122b.

A nickel layer 124a, 124b is formed on each copper pillar 120a, 120b. Solder micro-bumps (not shown) composed of a lead-free solder including tin and silver (Sn—Ag) are formed on each nickel layer 124a, 124b respectively. As discussed above, FIG. 1 depicts the solder micro-bumps after performance of a solder reflow process and as a result, the solder micro-bump of the first solder micro-bump assembly 110a and the second solder micro-bump assembly 110b are melted together and depicted as a unitary solder micro-bump structure 130.

During performance of the HTS test, the solder from the solder micro-bump structure 130 migrates onto the copper pillar 120a, 120b to form tin intermetallic layers 134a-d (e.g., nickel-tin (Ni—Sn) and copper-tin (Cu—Sn)). These tin intermetallic layers 134a-d are typically nickel rich and thus porous. This porosity allows for the migration of tin from the unitary solder micro-bump structure 130 to the copper pillar 120a, 120b. This migration of tin from the unitary solder micro-bump structure 130 to the copper pillar 120a, 120b depletes the amount of solder in the unitary solder micro-bump structure 130 leading to volumetric voiding and/or cracking defects 140.

Figure 2:
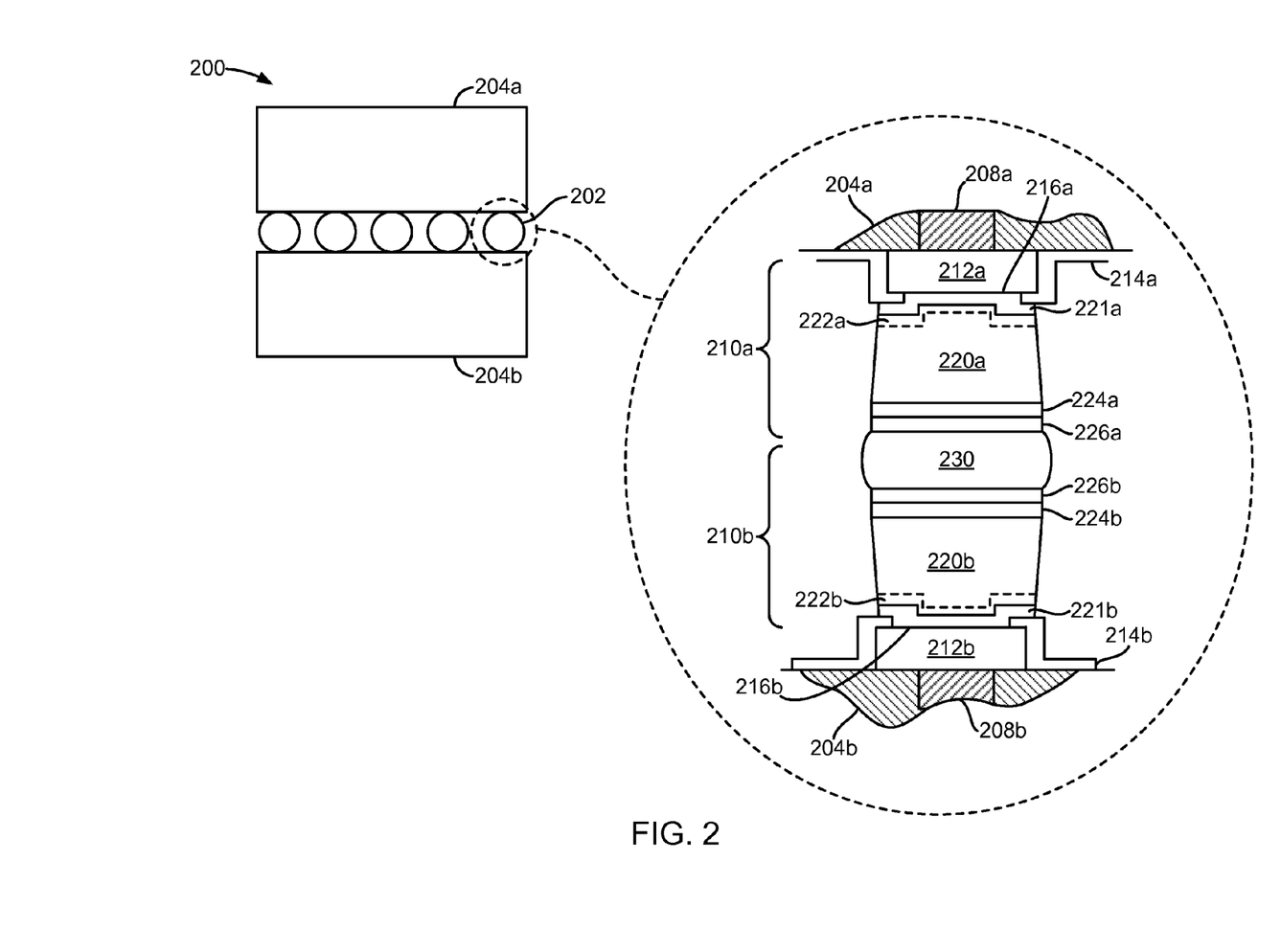
FIG. 2 is a schematic diagram depicting an exemplary die stack incorporating a solder micro-bump connection formed according to implementations described herein.

FIG. 2 is a schematic diagram depicting an exemplary die stack 200 incorporating a solder micro-bump connection 202 formed according to implementations described herein. The die stack 200 comprises a first IC die 204a and a second IC die 204b electrically coupled together by one implementation of the solder micro-bump connection 200 described herein. Each IC die 204a, 204b may be independently selected from programmable logic devices, such as field programmable gate arrays (FPGA), memory devices, processors or other IC logic structures.

FIG. 2 also includes an exploded schematic side view of the solder micro-bump connection 202. The solder micro-bump connection 202 comprises a first solder micro-bump assembly 210a coupled with a second solder micro-bump assembly 210b (collectively 210). It should be noted that FIG. 1 shows the first solder micro-bump assembly 210a coupled with a second solder micro-bump assembly 210b after exposure to a solder reflow process to couple the micro-bump assemblies 210a, 210b together, thus forming the micro-bump connection 202.

Each IC die 204a, 204b may independently comprise a sheet of insulative material, such as flexible polyimide film or tape, fiberglass, ceramic, silicon, silicon oxide, silicon nitride and like type integrated circuit packaging materials known in the art. Alternatively, each IC die 204a, 204b may independently comprise a semiconductor chip or die (e.g., a die configured for flip-chip bonding). Each IC die 204a, 204b comprises a layer of metal (e.g., copper, aluminum, gold, silver, nickel, tin, platinum, or a multilayer combination of the aforementioned metals that has been laminated and/or plated on a surface of the IC die 204a, 204b) that is deposited using known techniques, for example, photolithography, to define a conductive bond pad 212a, 212b (collectively 212). Each conductive bond pad 212a, 212b may be in electrical communication with one or more circuit traces (208a, 208b) or a plated through-hole, called a "via" (not shown).

A passivation layer 214a, 214b (collectively 214) is formed over each IC die 204a, 204b and a portion of the conductive bond pad 212a, 212b. Each passivation layer 214a, 214b may be a silicon nitride layer. The silicon nitride layer may be deposited using a chemical vapor deposition (CVD) process. An aperture 216a, 216b is formed in each passivation layer 214a, 214b to expose at least a portion of each conductive bond pad 212a, 212b.

A conductive pillar 220a, 220b is formed within each aperture 216a, 216b that is electrically and mechanically connected to the exposed portion of each conductive bond pad 212a, 212b. Exemplary conductive materials for each conductive pillar 220a, 220b include copper, nickel, or other solder materials. Exemplary processes for deposition of the conductive pillar include plating processes such as electrochemical plating (ECP) processes. As depicted in FIG. 2B, the conductive pillar 220a, 220b extends above a top surface of the passivation layer 214a, 214b. The conductive pillar 220a, 220b may have a thickness from about 5 micrometers to about 20 micrometers, for example, from about 10 micrometers to about 15 micrometers.

In some implementations, an adhesion/barrier layer 221a, 221b is formed over each passivation layer 214a, 214b and within each aperture 216a, 216b prior to deposition of each conductive pillar 220a, 220b. Exemplary adhesion/barrier layer materials include titanium, titanium tungsten (TiW), nickel (Ni), nickel vanadium (NiV), and/or chromium (Cr). Exemplary processes for deposition of the adhesion/barrier layer 221a, 221b include electrochemical plating (ECP) processes, electroless plating processes and physical vapor deposition (PVD) processes.

In some implementations, a conductive seed layer 222a, 222b is formed over each adhesion/barrier layer 221a, 221b prior to deposition of the conductive pillar 220a, 220b, and the conductive pillar 220a, 220b is formed on the conductive seed layer 222a, 222b. Exemplary conductive seed layer materials include copper and titanium. Exemplary processes for deposition of the conductive seed layer materials include ECP processes, electroless plating processes and PVD processes.

A plating layer is formed on each conductive pillar 220a, 220b. The plating layer may comprise copper and nickel. In some implementations, the plating layer is a bi-layer structure (see FIG. 2) comprising a nickel layer 224a, 224b and a copper layer 226a, 226b formed on the nickel layer 224a, 224b. In some implementations, the plating layer comprises a copper-nickel alloy (see FIG. 4).

A nickel layer 224a, 224b is formed on each conductive pillar 220a, 220b. Exemplary processes for deposition of the nickel layer include ECP processes and electroless plating processes. The nickel layers 224a, 224b may have a thickness from about 1 micrometer to about 10 micrometers, for example from about 3 micrometers to about 5 micrometers.

A copper layer 226a, 226b is formed on each nickel layer 224a, 224b. Exemplary processes for deposition of the copper layer 226a, 226b include ECP processes. The copper layer 226a, 226b may have a thickness from about 1 micrometer to about 10 micrometers, for example, from about 3 micrometers to about 5 micrometers.

Solder micro-bumps (not shown) composed of a lead-free solder including tin and silver (Sn—Ag) are formed on each copper layer 226a, 226b respectively. Exemplary processes for deposition of the solder micro-bumps included ECP processes. As discussed above, FIG. 2 depicts the solder micro-bumps after performance of a solder reflow process and as a result, the solder micro-bump of the first solder micro-bump assembly 210a and the second solder micro-bump assembly 210b are melted together and depicted as a unitary solder micro-bump structure 230.

Figure 3:
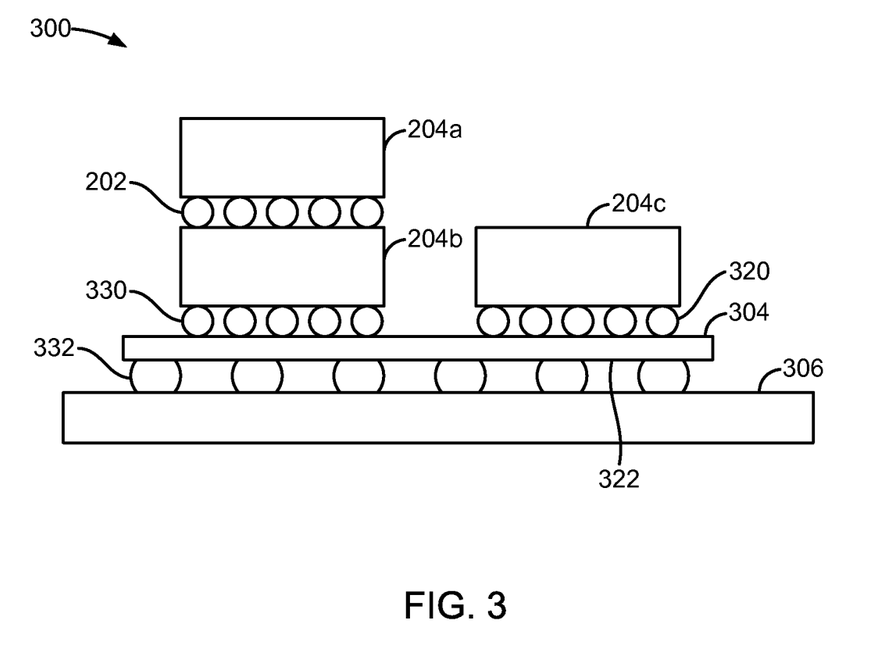
FIG. 3 is a schematic diagram depicting an exemplary implementation of an integrated chip package incorporating the solder micro-bump connection of FIG. 2.

FIG. 3 is a schematic diagram depicting an exemplary implementation of an integrated chip package 300 incorporating the solder micro-bump connection 202 of FIG. 2B. The integrated chip package 300 includes a plurality of IC dies 204a-c connected by a through silicon via (TSV) interposer 304 to a package substrate 306. The interposer 304 includes circuitry for electrically connecting the dies 204a-c to circuitry of the package substrate 306. The circuitry of the interposer 304 may optionally include transistors.

An interposer underfill material (not shown) may be disposed between the TSV interposer 304 and the package substrate 306 to increase the structural integrity of the package substrate to interposer interface. When present, the interposer underfill material typically covers package bumps 332, also known as "C4 bumps," which provide the electrical connection between the circuitry of the interposer 304 and the circuitry of the package substrate 306. In some implementations, the package bumps 332 may be similar to or the same as solder micro-bump connections 202 or solder micro-bump connection 400, later described with reference to FIG. 4. Although, only six package bumps are illustrated in FIG. 3 to minimize drawing clutter, the number of package bumps may be increased or decreased to meet design needs. The package substrate 306 may be mounted and connected to a printed circuit board (PCB), utilizing solder balls, wire bonding or other suitable technique. The PCB is not shown in FIG. 3.

The IC dies 204b, 204c are mounted to one or more surfaces of the interposer 304. The IC dies 204b, 204c may be programmable logic devices, such as field programmable gate arrays (FPGA), memory devices, processors or other IC logic structures. In the implementation depicted in FIG. 3, the IC dies 204b, 204c are mounted to a top surface 320 of the interposer 304 by micro-bumps 330. In some implementations, the micro-bumps 330 may be similar to or the same as solder micro-bump connections 202 or solder micro-bump connection 400. Although, only five micro bumps, coupling IC die 204b and IC die 204c to the interposer 304, are shown to minimize drawing clutter, the number of package bumps may be increased or decreased to meet design needs. The micro-bumps 330 electrically connect the circuitry of the IC dies 204b, 204c to circuitry of the interposer 304. The circuitry of the interposer 304 connects the micro-bumps 330 to selective package bumps 332, and hence, selective circuitry of the IC dies 204a-c to the package substrate 306, to enable communication of the IC dies 204a-c with the PCB after the integrated chip package 300 is mounted.

The IC dies 204a-c may be disposed on the interposer 304 in any suitable arrangement. For example, the IC dies 204a-c may be disposed on a top surface 320 of the interposer 304 in a 3-D array. Optionally, one or more IC dies 204a-c may be stacked on a bottom surface 322 of the interposer 304.

Figure 4:
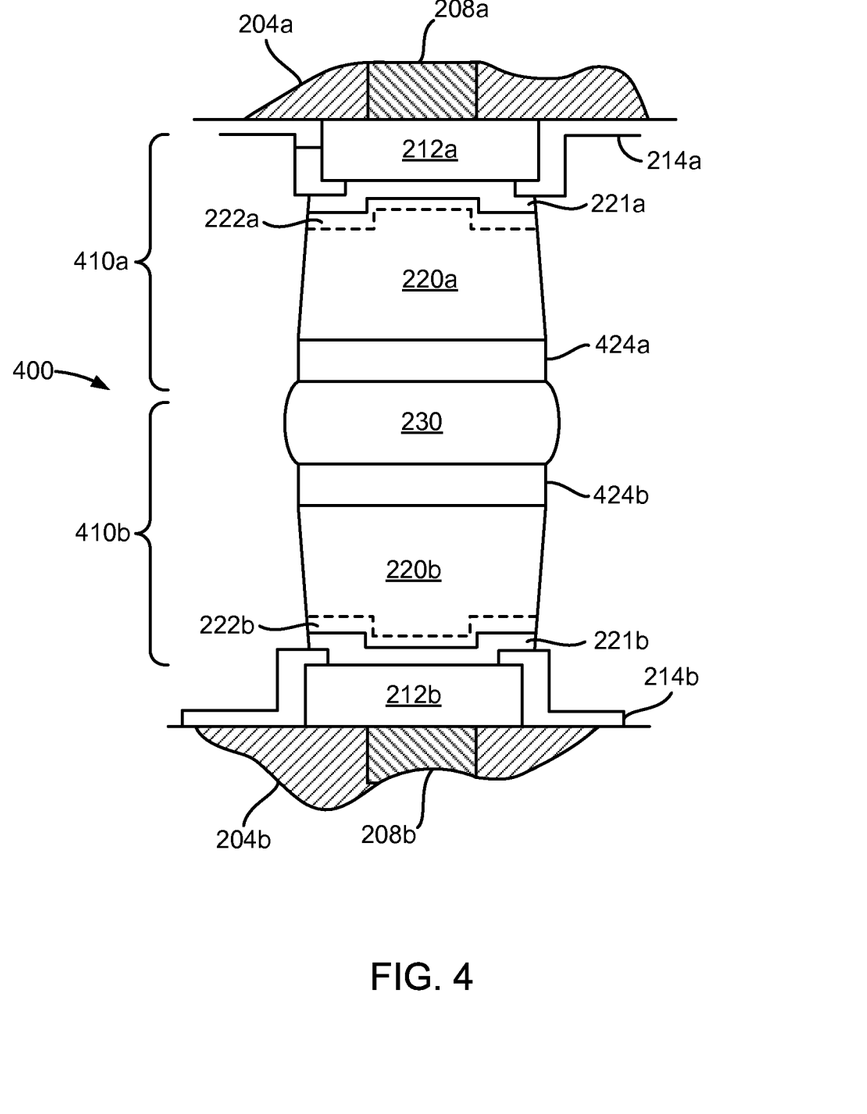
FIG. 4 is a partial schematic side view of a solder micro-bump connection formed according to implementations described herein.

FIG. 4 is a partial schematic side view of a solder micro-bump connection 400 formed according to implementations described herein. The solder micro-bump connection 400 may be used in place of solder micro-bump connection 202 depicted in FIG. 2. The solder micro-bump connection 400 comprises a first solder micro-bump assembly 410a coupled with a second solder micro-bump assembly 410b (collectively 410). It should be noted that FIG. 4 shows the first solder micro-bump assembly 410a coupled with a second solder micro-bump assembly 410b after exposure to a solder reflow process to couple the micro-bump assemblies 410a, 410b together, thus forming the micro-bump connection 400.

The solder micro-bump connection 400 is similar to the solder micro-bump connection 200 except that the plating layers (e.g., nickel layers 224a, 224b and the copper layers 226a, 226b) of solder micro-bump connection 200 have been replaced by copper-nickel alloy layers 424a, 424b (collectively 424). Exemplary processes for deposition of the copper-nickel alloy layers 424a, 424b include electrochemical plating (ECP) processes and electroless plating processes. The copper-nickel alloy layers 424a, 424b may have a thickness from about 0.5 μm to about 5 μm. Not to be bound by theory but it is believed that inclusion of the copper-nickel alloy layer suppresses the IMC reaction thus reducing the depletion of solder and minimizing the undesirable void formation that leads to voiding or cracking defects within the solder micro-bump joint.

FIGS. 5A-5I are schematic cross-sectional views illustrating a method for solder micro-bump connection formed according to implementations described herein. FIG. 6 is a flow diagram illustrating one implementation of a method 600 for fabricating the solder micro-bump connection of FIGS. 5A-5I.

Figure 5A:
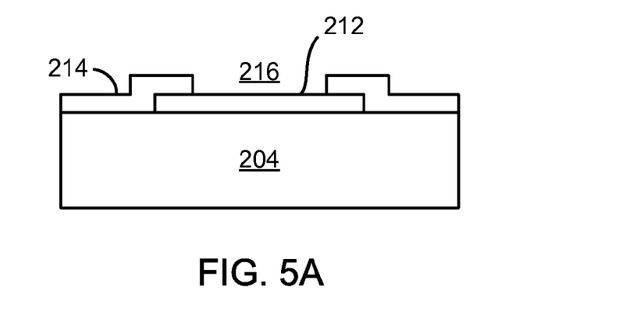
FIGS. 5A-5I are schematic cross-sectional views illustrating a method for solder micro-bump connection formed according to implementations described herein.
Figure 6:
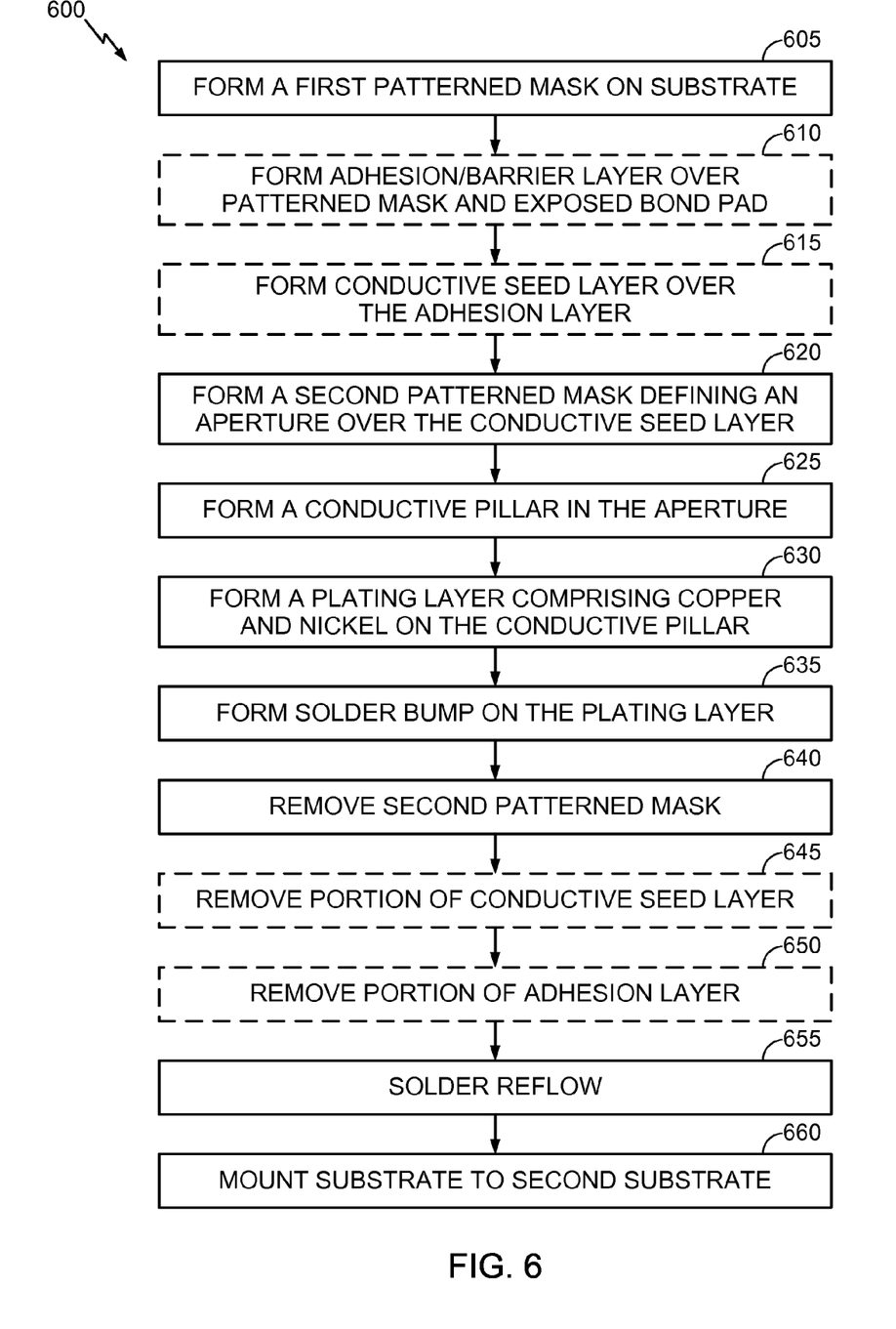
FIG. 6 is a flow diagram illustrating one implementation of a method for fabricating the solder micro-bump connection of FIGS. 5A-5I.

At block 610, a first passivation layer 214 is formed on a substrate as shown in FIG. 5A. The substrate 204 may comprise a sheet of insulative material, such as flexible polyimide film or tape, fiberglass, ceramic, silicon, and like type integrated circuit packaging materials known in the art. Alternatively, the substrate 204 may comprise a semiconductor chip or die (e.g., a die configured for flip-chip bonding). The substrate 204 comprises a layer of metal (e.g., copper, aluminum, gold, silver, nickel, tin, platinum, or a multilayer combination of the aforementioned metals that has been laminated and/or plated on a surface of the substrate 204) that is patterned using known techniques, for example, photolithography, to define a conductive bond pad 212. The conductive bond pad 212 may be in electrical communication with one or more circuit traces (not shown) or a plated through-hole, called a "via" (not shown).

A passivation layer 214 is formed over the substrate 204 and a portion of the conductive bond pad 212. Each passivation layer 214 may be a silicon nitride layer. The silicon nitride layer may be deposited using a chemical vapor deposition (CVD) process. An aperture 216 is formed in each passivation layer 214 to expose at least a portion of each conductive bond pad 212 as shown in FIG. 5A.

Figure 5B:
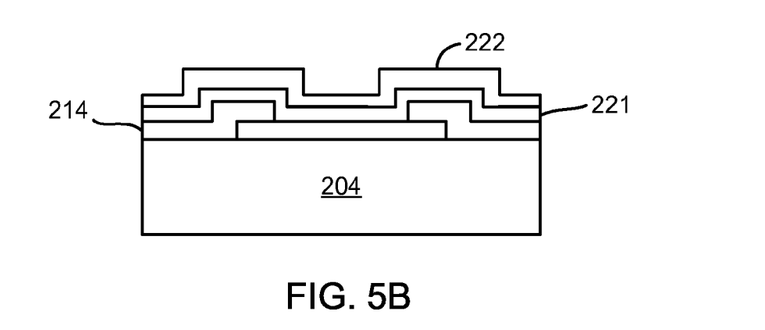

Optionally, at block 610, an adhesion/barrier layer 221 is formed over the passivation layer 214 and exposed conductive bond pad 212 as shown in FIG. 5B.

Optionally, at block 615, a conductive seed layer 222 is formed over the adhesion/barrier layer 221 if present as shown in FIG. 5B.

Figure 5C:
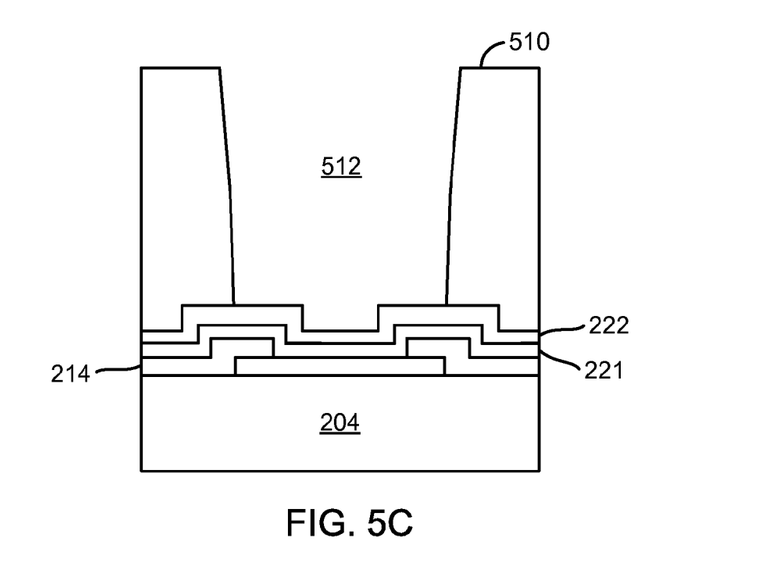

At block 620, a patterned mask 510 defining an aperture 512 is formed over the conductive seed layer 222 if present as shown in FIG. 5C. The aperture 512 exposes a portion of the conductive seed layer 222. The patterned mask 510 may comprise a photoresist material such as an acrylic or a polyimide plastic or, alternatively, an epoxy resin that is silk screened or spin-coated on the substrate 204. The photoresist material may be patterned using known photolithography techniques to define the aperture 512.

Figure 5D:
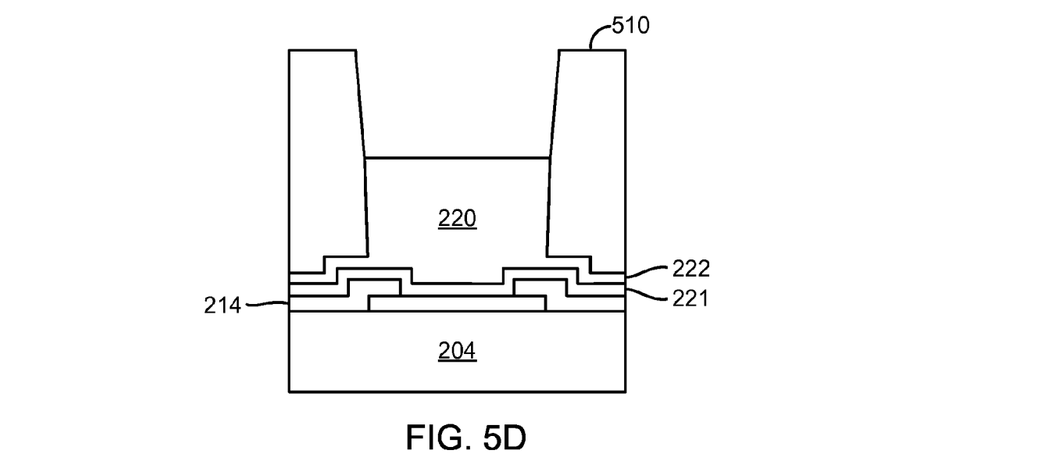
Figure 5E:
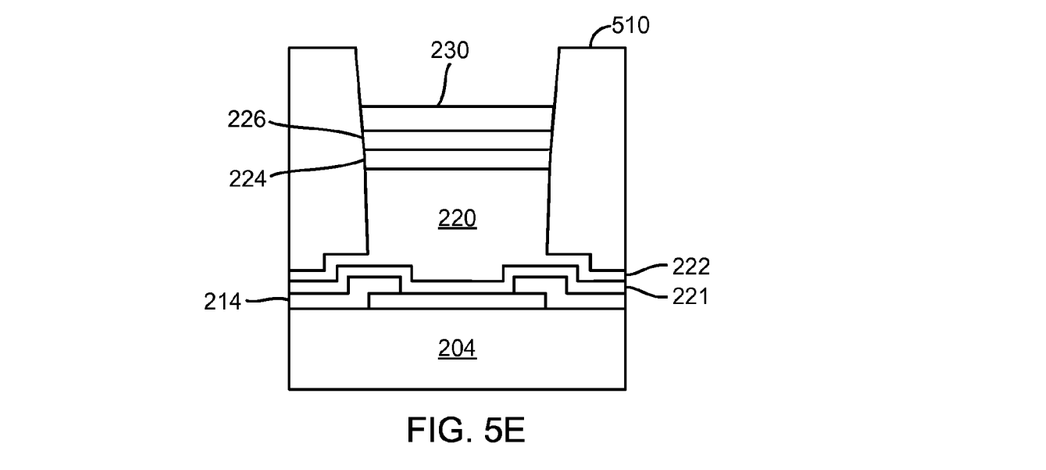

At block 625, a conductive pillar 220 is formed in the aperture 512 as shown in FIG. 5D. At block 630, a plating layer comprising copper and nickel is formed on the conductive pillar 220 as shown in FIG. 5E. In some implementations, the plating layer includes multiple layers. As shown in FIG. 5E, the plating layer is a bi-layer structure comprising a nickel layer 224 formed on the conductive pillar 220 and a copper layer 226 is formed on the nickel layer 224.

At block 635, a micro-bump 230 is formed on the plating layer. As shown in FIG. 5E, the micro-bump 230 is formed on the nickel layer 224.

Figure 5F:
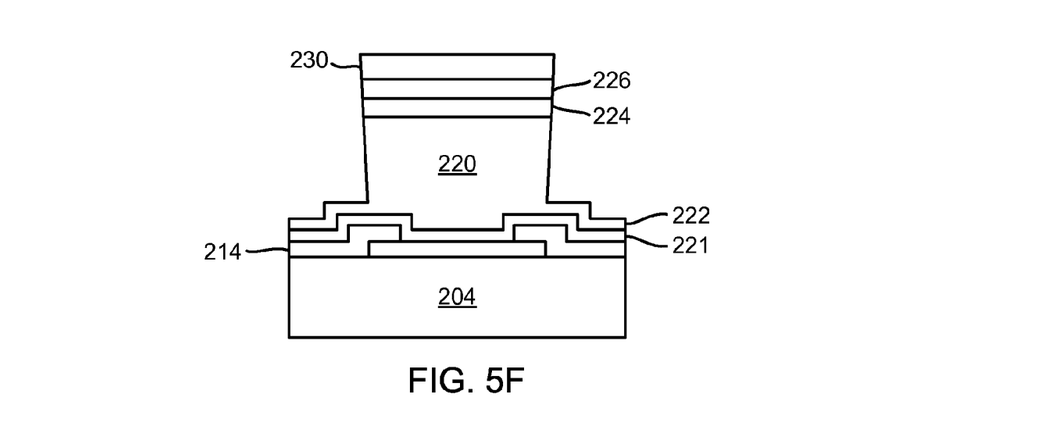

At block 640, the patterned mask 510 is removed to expose a portion of the conductive seed layer 222 as shown in FIG. 5F. The patterned mask 510 may be removed using known photoresist removal techniques.

Figure 5G:
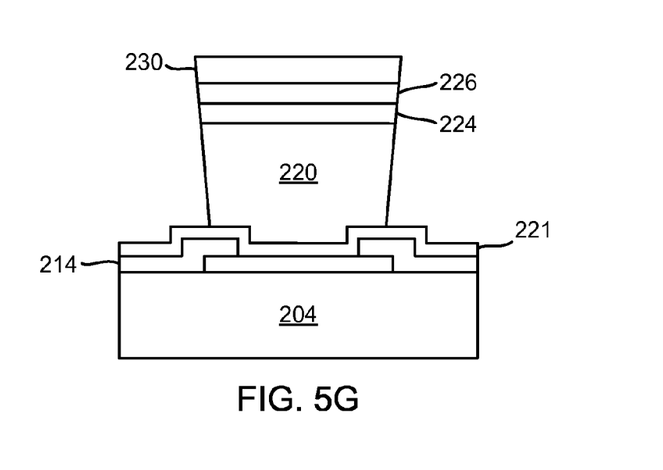

At block 645, the exposed portions of the conductive seed layer 222 are removed to expose portions of the adhesion layer 221 as shown in FIG. 5G. The exposed portions of the conductive seed layer 222 may be removed using known etching techniques, for example, wet etching techniques.

Figure 5H:
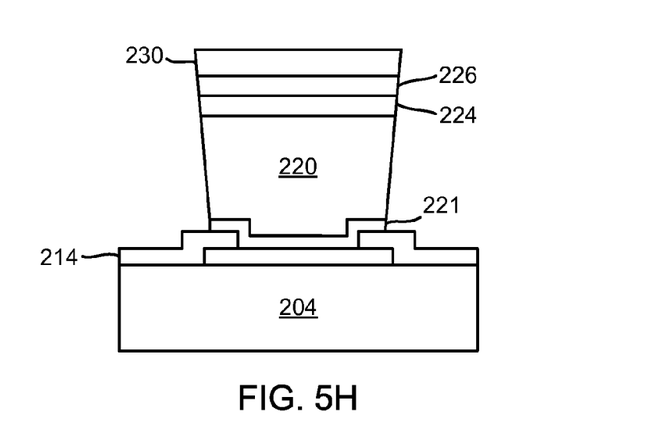

At block 650, the exposed portions of the adhesion layer 221 are removed as shown in FIG. 5H. The exposed portions of the adhesion layer 221 may be removed using known etching techniques, for example, wet etching techniques.

Figure 5I:
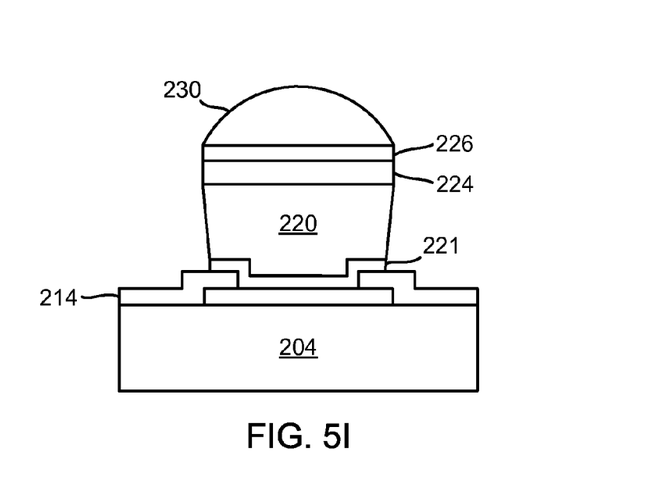

At block 655 the micro-bump 230 is exposed to a solder reflow process as shown in FIG. 5I. At block 660, the substrate 204 is mounted to a second substrate (not shown) utilizing the micro-bump 230. The micro-bump 230 may be solder reflowed to an area of a second substrate to form a mechanical and electrical connection between the substrate 204 and the second substrate (not shown). In some implementations, the micro-bump 230 may be solder reflowed to a bond pad of the second substrate. In some implementations, the micro-bump 230 may be solder reflowed to a corresponding micro-bump of the second substrate. In some implementations, the micro-bump 230 may be solder reflowed to a corresponding conductive pillar of the second substrate. After mounting, underfill material may be wicked between the substrate 204 and the second substrate. After curing, the die underfill material provides structural rigidity between the substrate 204 and the second substrate.

Improved solder joints and methods of forming improved solder joints for integrated circuits have been provided. In some implementations, the improved solder joints described herein have been exposed to HTS testing for over 2,000 hours without experiencing the cracking defects present in conventionally known solder joints after HTS testing between 500 and 700 hours.

While the foregoing is directed to embodiments of the present invention, other and further embodiments of the invention may be devised without departing from the basic scope thereof, and the scope thereof is determined by the claims that follow.

What is claimed is:

1. A solder bump connection, comprising:
    a conductive bond pad formed on a substrate;
    a first conductive pillar formed over the conductive bond pad;
    a first plating layer formed on the first conductive pillar, wherein the first plating layer comprises copper and nickel;
    a solder bump structure formed on the first plating layer in electrical communication with the first plating layer;
    a second plating layer contacting the solder bump structure, wherein the second plating layer comprises copper and nickel; and
    a second conductive pillar contacting the second plating layer.

2. The solder bump connection of claim 1, wherein the first plating layer is a bi-layer structure comprising:
    a nickel layer formed on the first conductive pillar; and
    a copper layer formed on the nickel layer in electrical communication with the solder bump structure.

3. The solder bump connection of claim 1, wherein the first plating layer comprises a copper-nickel alloy.

4. The solder bump connection of claim 1, wherein the first conductive pillar extends through a passivation layer, the first conductive pillar comprises copper and the conductive bond pad comprises aluminum.

5. The solder bump connection of claim 1, wherein the substrate comprises a semiconductor die or a through silicon via (TSV) interposer.

6. The solder bump connection of claim 1, wherein the substrate comprises an integrated circuit package substrate.

7. The solder bump connection of claim 1, wherein the solder bump structure is a micro-bump structure.

8. The solder bump connection of claim 1, wherein a barrier layer is formed in between the conductive bond pad and the first conductive pillar.

9. The solder bump connection of claim 5, wherein the semiconductor die is selected from the group consisting of: a programmable logic device, a processor and a memory device.

10. An integrated circuit device, comprising:
    a substrate;
    an integrated circuit formed on the substrate;
    a plurality of conductive bond pads formed in the integrated circuit, each conductive bond pad of the conductive bond pads being enabled to form an electrical coupling with a portion of the integrated circuit; and
    a plurality of solder bump connections, each solder bump connection of the plurality of solder bump connections being enabled to form an electrical coupling between a conductive bond pad and circuitry outside the integrated circuit device, wherein each solder bump connection comprises:
    a first conductive pillar formed over the conductive bond pad;

a first plating layer formed on the first conductive pillar, wherein the first plating layer comprises copper and nickel;

a solder bump structure formed on the first plating layer in electrical communication with the first plating layer;

a second plating layer contacting the solder bump connection, wherein the second plating layer comprises copper and nickel; and a second conductive pillar contacting the second plating layer.

11. The integrated circuit device of claim 10, wherein the first plating layer is a bi-layer structure comprising:

a nickel layer formed on the first conductive pillar; and a copper layer formed on the nickel layer in electrical communication with the solder bump structure.

12. The integrated circuit device of claim 10, wherein the first plating layer is a copper-nickel alloy.

13. The integrated circuit device of claim 10, further comprising:

a passivation layer formed on the substrate having an aperture exposing at least a portion of a conductive bond pad of the plurality of conductive bond pads, wherein the first conductive pillar is formed within the aperture, the first conductive pillar comprises copper and the conductive bond pad comprises aluminum.

14. The integrated circuit device of claim 10, wherein the substrate comprises a semiconductor die or a through silicon via (TSV).

15. The integrated circuit device of claim 10, wherein the substrate comprises an integrated circuit package substrate.

16. The integrated circuit device of claim 14, wherein the semiconductor die is selected from the group consisting of: a programmable logic device, a processor and a memory device.

17. A method for fabricating a solder bump connection, comprising:

forming a first conductive pillar over a conductive bond pad deposited on a substrate;

forming a first plating layer comprising copper and nickel on the first conductive pillar;

forming a first lead-free solder bump on the first plating layer, wherein the lead-free solder bump includes tin and silver;

forming a second conductive pillar over a conductive bond pad deposited on a semiconductor die;

forming a second plating layer comprising copper and nickel on the second conductive pillar;

forming a second lead-free solder bump on the second plating layer, wherein the second lead-free solder bump includes tin and silver; and reflow soldering the lead-free solder bump of the substrate to the lead-free solder bump of the semiconductor die.

18. The method of claim 17, wherein forming a first plating layer comprising copper and nickel on the first conductive pillar comprises:

plating a nickel layer on the first conductive pillar; and plating a copper layer on the nickel layer.

19. The method of claim 17, wherein forming a first plating layer comprising copper and nickel on the first conductive pillar comprises:

plating a copper-nickel alloy layer on the first conductive pillar.

20. The method of claim 17, wherein the semiconductor die is selected from the group consisting of: a programmable logic device, a processor and a memory device.

\* \* \* \* \*